(12) United States Patent
Jang et al.

(10) Patent No.: US 7,423,444 B2
(45) Date of Patent: Sep. 9, 2008

(54) DIGITAL TEST APPARATUS FOR TESTING ANALOG SEMICONDUCTOR DEVICE(S)

(75) Inventors: Jin-Mo Jang, Suwon-si (KR); Young-Bu Kim, Seongnam-si (KR); Jung-Hye Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 170 days.

(21) Appl. No.: 11/341,255

(22) Filed: Jan. 26, 2006

(65) Prior Publication Data
US 2006/0170575 A1    Aug. 3, 2006

(30) Foreign Application Priority Data
Feb. 3, 2005    (KR) ...................... 10-2005-0010225

(51) Int. Cl.
*G01R 31/26* (2006.01)
(52) U.S. Cl. .................................. 324/765; 324/158.1
(58) Field of Classification Search ........................ None
See application file for complete search history.

(56) References Cited

U.S. PATENT DOCUMENTS

| | | | | |
|---|---|---|---|---|
| 4,740,744 A | * | 4/1988 | Lubarsky et al. | 324/76.58 |
| 4,926,351 A | * | 5/1990 | Wratil et al. | 702/57 |
| 5,191,956 A | * | 3/1993 | Ibarrola | 194/317 |
| 5,883,523 A | | 3/1999 | Ferland et al. | |
| 6,801,478 B1 | * | 10/2004 | Nishimoto | 369/13.14 |
| 7,054,778 B2 | * | 5/2006 | Geiger et al. | 702/117 |
| 7,173,443 B1 | * | 2/2007 | Asami | 324/765 |

FOREIGN PATENT DOCUMENTS

| | | | |
|---|---|---|---|
| JP | 2000221248 A | * | 8/2000 |
| JP | 2001 0305193 | | 10/2001 |
| JP | 2006215036 A | * | 8/2006 |
| KR | 1999 0035473 | | 5/1999 |
| KR | 2001 0051609 | | 6/2001 |

OTHER PUBLICATIONS

English Abstract*** for 0035473 Korean, 1999.
English Abstract*** for 0305193 Japan, 2001.
English Abstract*** for 0051609 Korean, 2001.

* cited by examiner

*Primary Examiner*—Paresh Patel
(74) *Attorney, Agent, or Firm*—F. Chau & Associates, LLC

(57) ABSTRACT

A digital test apparatus for testing an analog semiconductor device includes a low pass filter which passes only a low frequency analog signal from among analog signals output from the analog semiconductor device, a rectifying unit connected to the low pass filter for converting the analog signal output from the low pass filter into a DC voltage, a high pass filter which passes only a high frequency analog signal from among analog signals output from the analog semiconductor device, a high frequency power detecting unit connected to the high pass filter for converting the analog signal output from the high pass filter into a DC voltage, and a digital measuring unit which is connected to the rectifying unit and the high frequency power detecting unit and measures the DC voltages to determine whether the analog signals output from the analog semiconductor device are desirable.

13 Claims, 7 Drawing Sheets

DIGITAL TEST APPARATUS FOR TESTING ANALOG SEMICONDUCTOR DEVICE(S)

CROSS-REFERENCE TO RELATED PATENT APPLICATIONS

This application claims the benefit of Korean Patent Application No. 10-2005-0010225, filed on Feb. 3, 2005, in the Korean Intellectual Property Office, the disclosure of which is incorporated herein in its entirety by reference.

BACKGROUND OF THE INVENTION

1. Field of the Invention

The present invention relates to a digital test apparatus for testing a semiconductor device, and more particularly, to a digital test apparatus for converting an analog signal output from an analog semiconductor device into a DC (direct current) voltage and measuring the DC voltage.

2. Description of Related Art

Semiconductor devices can be classified as either analog or digital. An analog semiconductor device processes an analog signal and includes an operational amplifier and an audio output amplifier. A digital semiconductor device processes a digital signal and includes a small-scale integrated circuit (SSI), a large-scale integrated circuit (LSI) and a memory IC (integrated circuit).

Testers are used for evaluating the capabilities of the semiconductor devices. Analog and digital specific testers are used for analog semiconductor devices and digital semiconductor devices, respectively.

FIG. 1 shows an analog test apparatus 101 for testing a plurality of analog semiconductor devices 111,112. The analog test apparatus 101 includes an analog tester 131 and a plurality of switches 121~124.

The analog tester 131 includes an AC digitizer 135 for converting analog signals AN1~AN4 into digital signals. The analog tester 131 measures the digital signals to determine the capabilities of the analog semiconductor devices 111, 112.

The plurality of switches 121~124 are sequentially turned on when testing the analog semiconductor devices 111,112 such that the analog signals AN1~AN4 output from output pins P1~P4 of the analog semiconductor devices 111, 112 are transmitted to the AC digitizer 135.

The AC digitizer 135 is needed to allow the analog tester 131 to test the analog semiconductor devices 111, 112. Including AC digitizers 135 in the analog tester 131 can become cost prohibitive.

In applications using a limited number of AC digitizers 135, the plurality of switches 121~124 need to be used to simultaneously test the plurality of analog semiconductor devices 111, 112. The use of the plurality of switches 121~124 increases the time needed for testing the analog semiconductor devices 111, 112, thus increasing time related expenses.

Also, if the frequencies of the analog signals AN1~AN4 output from the analog semiconductor devices 111, 112 are high, the capability of the AC digitizer 135 needs to be improved, further increasing the cost for testing the analog semiconductor devices 111, 112.

Accordingly, to reduce the test cost, an inexpensive test apparatus is needed for simultaneously testing a plurality of analog semiconductor devices 111, 112 which output high frequency analog signals AN1.

SUMMARY OF THE INVENTION

According to an exemplary embodiment of the present invention, a digital test apparatus comprises a signal converting unit electrically coupled to an analog semiconductor device for converting an analog signal output from the analog semiconductor device into a DC voltage and outputting the DC voltage, and a digital measuring unit electrically coupled to the signal converting unit for measuring the DC voltage output from the signal converting unit to evaluate the analog signal according to the DC voltage.

A plurality of signal converting units and digital measuring units may be included for simultaneously testing a plurality of analog semiconductor devices.

According to an exemplary embodiment of the present invention, a digital test apparatus comprises a low pass filter for passing only a low frequency analog signal from among analog signals output from an analog semiconductor device, and a rectifying unit electrically coupled to the low pass filter for converting the analog signal output from the low pass filter into a first DC voltage and outputting the first DC voltage. The digital test apparatus comprises a high pass filter for passing only a high frequency analog signal from among analog signals output from the analog semiconductor device, and a high frequency power detecting unit electrically coupled to the high pass filter for converting the analog signal output from the high pass filter into a second DC voltage and outputting the second DC voltage. The digital test apparatus comprises a digital measuring unit electrically coupled to the rectifying unit and the high frequency power detecting unit and measures the first and the second DC voltages output from the rectifying unit and the high frequency power detecting unit and evaluating the analog signals output from the analog semiconductor device according to the first and the second DC voltages.

In an exemplary embodiment, the digital measuring unit comprises a first comparing unit for comparing the first DC voltage output from the rectifying unit with a reference voltage, a second comparing unit for comparing the second DC voltage output from the high frequency power detecting unit with the reference voltage, and a determining unit which receives outputs of the comparing units and evaluates the analog signals output from the analog semiconductor device according to the outputs of the comparing units.

In an exemplary embodiment, the digital measuring unit is implemented in an ATE (automatic test equipment) for testing the semiconductor device. Further, the low pass filter, the rectifying unit, the high pass filter and the high frequency power detecting unit are implemented in a test board for interfacing the semiconductor device with the ATE.

In an exemplary embodiment, the digital test apparatus includes at least one additional low pass filter, at least one additional rectifying unit, at least one additional high pass filter, at least one additional high frequency power detecting unit and at least one additional comparing unit for simultaneously testing a plurality of analog semiconductor devices.

In an exemplary embodiment, the analog semiconductor device comprises a first pin for outputting the low frequency analog signal and a second pin for outputting the high frequency analog signal, the low pass filter connected to the first pin, the high pass filter connected to the second pin. A plurality of first pins for outputting the low frequency analog signal and second pins for outputting the high frequency analog signal are included within the analog semiconductor device.

According to an exemplary embodiment of the present invention, a digital test apparatus comprises a switching unit, including a first output pin and a second output pin, receives a low frequency analog signal and a high frequency analog signal output from an analog semiconductor device, and is controlled by a controlling signal to output the low frequency analog signal through the first output pin and output the high frequency analog signal through the second output pin. The digital test apparatus comprises a low pass filter electrically coupled to the first output pin for passing only a low frequency component in the low frequency analog signal output through the first output pin, and a rectifying unit, electrically coupled to the low pass filter, for converting the analog signal output from the low pass filter into a first DC voltage outputting the first DC voltage. The digital test apparatus comprises a high pass filter, electrically coupled to the second output pin, for passing only a high frequency component in the high frequency analog signal output through the second output pin, and a high frequency power detecting unit, electrically coupled to the high pass filter, for converting the analog signal output from the high pass filter into a second DC voltage and outputting the second DC voltage. The digital test apparatus comprises a digital measuring unit, electrically coupled to the rectifying unit and the high frequency power detecting unit, for measuring the first and the second DC voltages output from the rectifying unit and the high frequency power detecting unit and evaluating the analog signals output from the analog semiconductor device according to the first and the second DC voltages.

In an exemplary embodiment, the switching unit comprises a relay controlled by the controlling signal.

In an exemplary embodiment, the digital measuring unit comprises a first comparing unit for comparing the first DC voltage output from the rectifying unit with a reference voltage, a second comparing unit for comparing the second DC voltage output from the high frequency power detecting unit with the reference voltage, a determining unit for receiving outputs of the comparing units and evaluating the analog signals output from the analog semiconductor device according to the outputs of the comparing units, and a switch controlling unit for generating the controlling signal.

In an exemplary embodiment, the digital measuring unit is implemented in an ATE (automatic test equipment) for testing the semiconductor device. Further, the switching unit, the low pass filter, the rectifying unit, the high pass filter and the high frequency power detecting unit are implemented in a test board for interfacing the semiconductor device with the ATE.

In an exemplary embodiment, the digital test apparatus comprises at least one additional switching unit, at least one additional low pass filter, at least one additional rectifying unit, at least one additional high pass filter, at least one additional high frequency power detecting unit and at least one additional comparing unit for simultaneously testing a plurality of analog semiconductor devices.

In an exemplary embodiment, the analog semiconductor device comprises one or more pins which each output both the low frequency analog signal and the high frequency analog signal. Further, one switching unit may be electrically coupled to each of these pins.

BRIEF DESCRIPTION OF THE DRAWINGS

The present invention will become more apparent by describing in detail exemplary embodiments thereof with reference to the attached drawings in which.

DETAILED DESCRIPTION OF PREFERRED EMBODIMENTS

Figure 1:
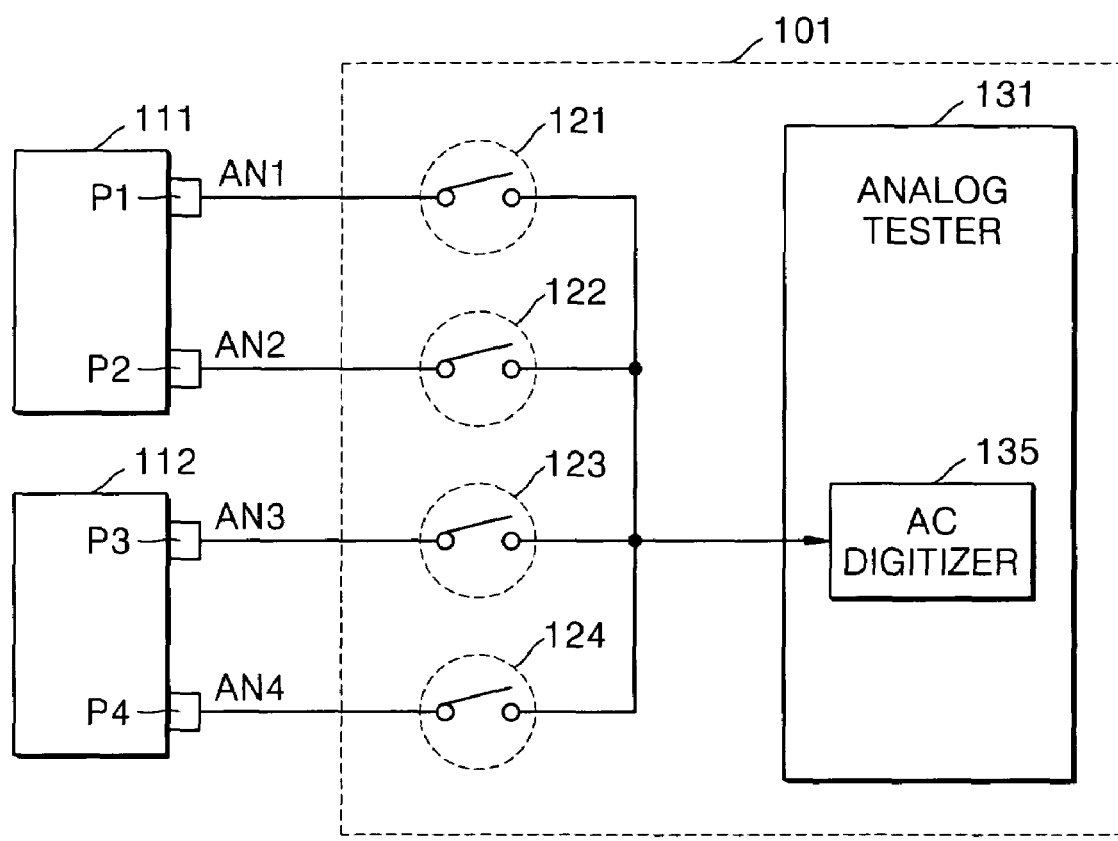
FIG. 1 shows a conventional analog test apparatus connected to a plurality of analog semiconductor devices.

The present invention will now be described more fully with reference to the accompanying drawings, in which exemplary embodiments of the invention are shown. Like reference numerals denote like elements throughout the drawings, and thus their description will not be repeated.

Figure 2:
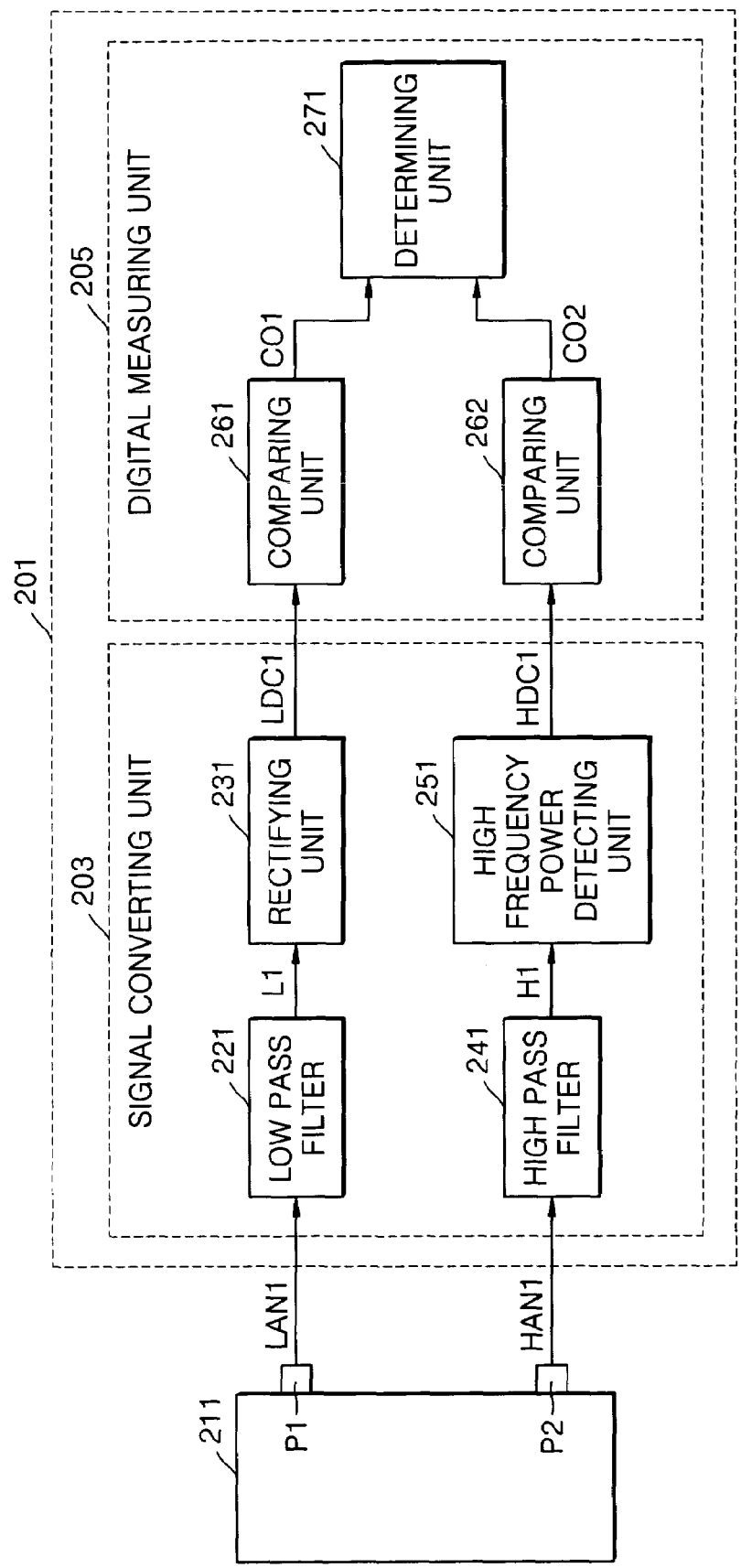
FIG. 2 shows a digital test apparatus according to an exemplary embodiment of the present invention, connected to an analog semiconductor device.

FIG. 2 shows a digital test apparatus according to an embodiment of the present invention, connected to an analog semiconductor device. The digital test apparatus 201 includes a signal converting unit 203 and a digital measuring unit 205. The analog semiconductor device 211 to be tested includes a pin P1 outputting a low frequency analog signal LAN1 and a pin P2 outputting a high frequency analog signal HAN1.

The signal converting unit 203 converts the power of an input analog signal into a DC output voltage. When testing the analog semiconductor device 211, the signal converting unit 203 receives the analog signals LAN1, HAN1 output from the analog semiconductor device 211, and converts the powers of the analog signals LAN1, HAN1 into DC signals LDC1, HDC1, respectively.

The signal converting unit 203 includes a low pass filter 221, a rectifying unit 231, a high pass filter 241 and a high frequency power detecting unit 251.

The low pass filter 221 passes only a low frequency component in the analog signal input from the outside. When testing the analog semiconductor device 211, the low pass filter 221 is connected to the pin P1 of the analog semiconductor device 211 and passes only the low frequency component L1 in the analog signal LAN1 from the pin P1. Accordingly, a high frequency component included in the analog signal LAN1 is removed.

The rectifying unit 231 is connected to the low pass filter 221 and converts the power of the low frequency analog signal L1 output from the low pass filter 221 into the DC signal LDC1. The rectifying unit will be described in detail with reference to FIGS. 4 and 5.

The high pass filter 241 passes only the high frequency component in the analog signal input from the outside. When testing the analog semiconductor device 211, the high pass filter 241 is connected to the pin P2 of the analog semiconductor device 211 and passes only the high frequency component H1 in the analog signal HAN1 from the pin P2. Accordingly, the low frequency component included in the analog signal HAN1 is removed.

The low pass filter 221 and/or the high pass filter 241 may be replaced by band pass filters for passing only specific frequencies.

The high frequency power detecting unit 251 converts the power of the high frequency analog signal H1 output from the high pass filter 241 into the DC signal HDC1. A graph of the voltage of the output signal HDC1 for the input signal H1 of the high frequency power detecting unit 251 is shown in FIG. 3.

Figure 3:
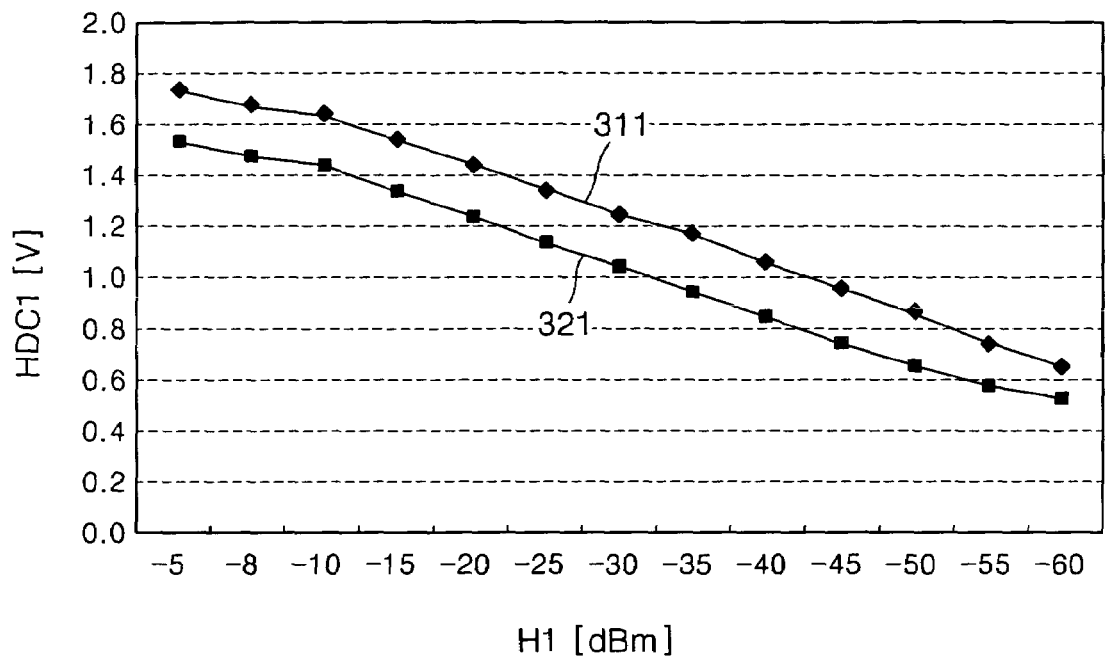
FIG. 3 is a graph showing the input and output voltages of a high frequency power detecting unit shown in FIG. 2.

FIG. 3 is a graph of the input and output voltages when two analog signals 311, 312 input from, for example, a semiconductor device AD8313 which is produced by Analog Devices, Inc., are converted into the DC signal HDC1. The frequency of the analog signal 311 is 1.9 GHz and the frequency of the analog signal 321 is 10 MHz.

The higher the frequency of the analog signal H1 input to the high frequency power detecting unit 251, the higher the DC voltage of the signal HDC1 output from the high frequency power detecting unit 251. The DC voltage of the signal HDC1 output from the high frequency power detecting unit 251 is proportional to the power of the signal H1 input to the high frequency power detecting unit 251. If the power of the signal H1 input to the high frequency power detecting unit 251 is low, the DC voltage of the signal LDC1 output from the high frequency power detecting unit 251 is low, and, if the power of the signal H1 input to the high frequency power detecting unit 251 is high, the DC voltage of the signal HDC1 output from the high frequency power detecting unit 251 is high. High frequency power detecting units 251 are known in the art; these include the semiconductor device such as AD8313. Therefore, the structure and the operation of the high frequency power detecting unit 251 will not be described here. While the AD8313 is given as a specific example of the high frequency power detecting unit 251, other devices capable of converting a modulated radio frequency (RF) signal to an equivalent decibel-scaled value at its DC output may be implemented.

The digital measuring unit 205 measures the DC voltage of the signals LCD1, HDC1 output from the signal converting unit 203 and determines whether the analog semiconductor device 211 is good or bad (e.g., operating within a given specification). The digital measuring unit 205 includes a plurality of comparing units 261, 262 and a determining unit 271.

Figure 6:
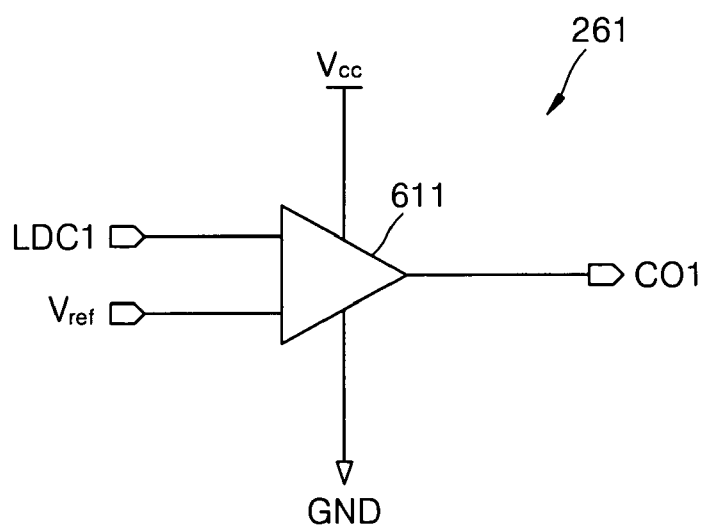
FIG. 6 shows an example of comparing units shown in FIG. 2.

The comparing unit 261 is connected to the rectifying unit 231 and compares the DC voltage of the signal LDC1 output from the rectifying unit 231 with a reference voltage (Vref of FIG. 6).

The comparing unit 262 is connected to the high frequency power detecting unit 251 and compares the DC voltage of the signal HDC1 output from the high frequency power detecting unit 251 with a reference voltage (Vref of FIG. 6). The comparing units 261, 262 are described in detail with reference to FIG. 6.

The determining unit 271 receives the signals C01, C02 output from the comparing units 261, 262, respectively, and determines whether these signals are good or bad. For example, if the signals C01, C02 have a high level, it is determined that the analog semiconductor device 211 is good (e.g., operating within a given specification), and if the signals C01, C02 have a low level, it is determined that the analog semiconductor device 211 is bad (e.g., operating outside a given specification).

The digital measuring unit 205 is installed in a semiconductor tester, e.g., automatic test equipment (hereinafter, referred to as ATE). The signal converting unit 203 is preferably installed in a test board for interfacing the analog semiconductor device 211 with the ATE.

In the digital test apparatus 201 according to an exemplary embodiment of the present invention, the analog signals LAN1, HAN1 output from the analog semiconductor device 211 are converted into a DC voltage by the rectifying unit 231 if the frequencies thereof are low, and are converted into a DC voltage by the high frequency power detecting unit 251 if the frequencies thereof are high. The converted signals LDC1, HDC1 are measured by the measuring unit 205 to determine whether the signals are good or bad.

According to an exemplary embodiment of the present invention, although the frequency of the high frequency analog signal HAN1 output from the analog semiconductor device 211 can be high, the analog semiconductor device can be tested using the digital test apparatus 201, without needing an AC digitizer (135 of FIG. 1). Accordingly, the test cost of the analog semiconductor device 211 can be reduced.

Figure 4:
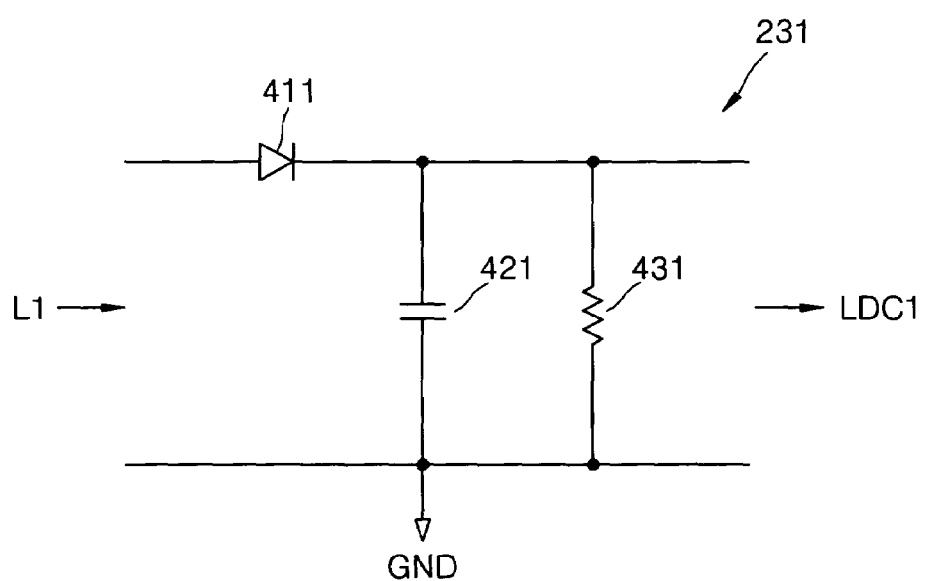
FIG. 4 shows an example of a rectifying unit shown in FIG. 2.
Figure 5:
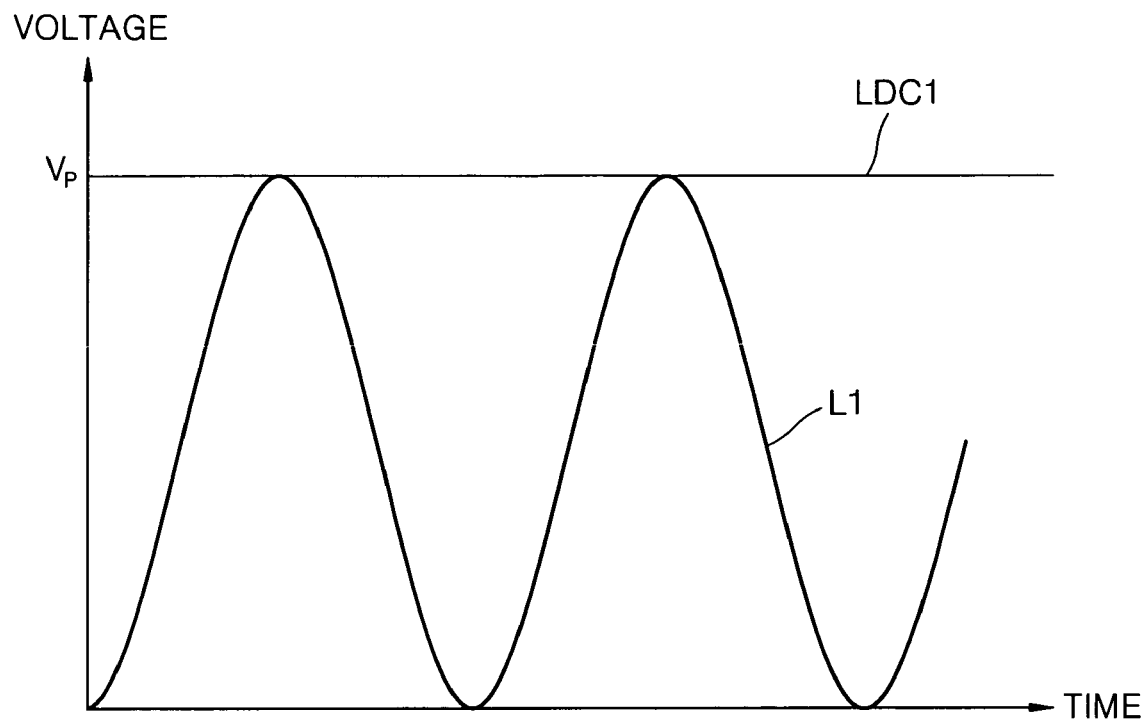
FIG. 5 shows waveforms of the input and output signals of the rectifying unit shown in FIG. 4.

FIG. 4 shows an example of the rectifying unit 231 shown in FIG. 2, and FIG. 5 shows waveforms of the input and output signals of the rectifying unit 231 shown in FIG. 4. The rectifying unit 231 includes a diode 411, a capacitor 421 and a resistor 431.

The diode 411 rectifies the input low frequency analog signal L1 and the capacitor 412 and the resistor 431 smooth the rectified signal to output the smoothed signal.

The rectifying unit 231 rectifies the low frequency analog signal L1 such that the DC voltage of the signal LDC1 is substantially equal to the peak value of the analog signal L1.

Accordingly, the low frequency analog signal L1 input to the rectifying unit 231 is converted into the DC output signal LDC1 substantially equal to the peak voltage (Vp) of the low frequency analog signal L1 and thus the converted signal LDC1 is output.

FIG. 6 shows an example of the comparing unit 261 shown in FIG. 2. Comparing unit 262 is substantially similar to the comparing unit 261 and thus a detailed description of comparing 262 is omitted. The comparing unit 261 includes a comparator 611 for receiving and comparing the output signal LDC1 of the signal converting unit 203 and the reference voltage (Vref). The comparator 611 outputs a high level, that is, a power supply voltage Vcc, if the voltage of the output signal LDC1 is higher than the reference voltage Vref, and outputs a low level, that is, a ground voltage GND, if the voltage of the output signal LDC1 is lower than the reference voltage Vref.

The reference voltage Vref may be set to two voltages, for example, an input high voltage Vih and an input low voltage Vil. In this case, if the voltage of the output signal LDC1 is lower than the input low voltage Vil, the low level is output, and, if the voltage of the output signal LDC1 is higher than the input high voltage Vih, the high level is output. It is preferable that the determining unit (271 of FIG. 2) determines that the analog semiconductor device 211 is good if the output signal of the comparator 611 is higher than the input high voltage Vih or lower than the input low voltage Vil. An output between the input low voltage Vil and the input high voltage Vih is in a high impedance state and corresponds to a bad analog semiconductor device 211.

Figure 7:
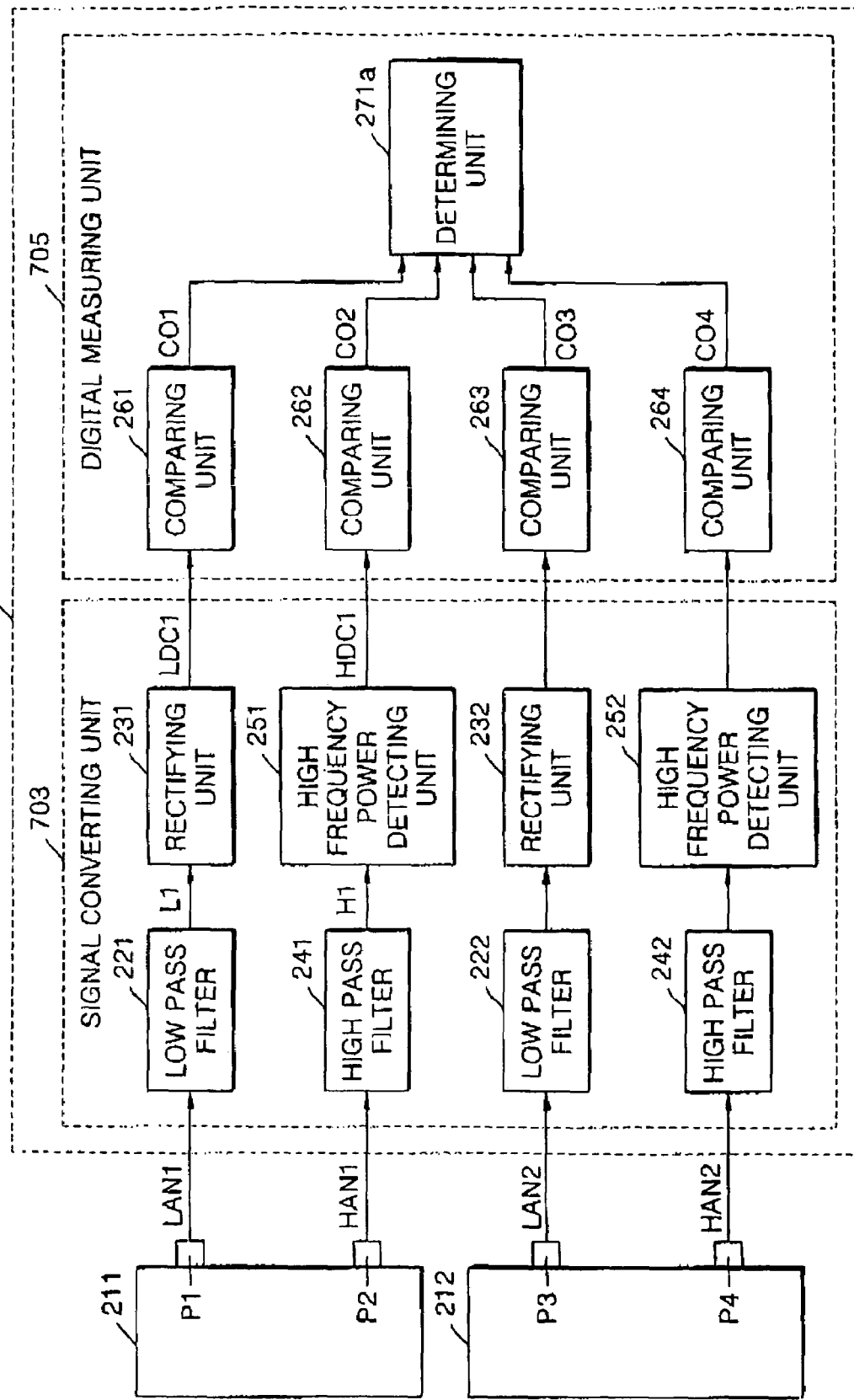
FIG. 7 shows a digital test apparatus according to an exemplary embodiment of the present invention, connected to analog semiconductor devices.

FIG. 7 shows a digital test apparatus according to an exemplary embodiment of the present invention, connected to analog semiconductor devices 211 and 212. The digital test apparatus 701 includes a signal converting unit 703 and a digital measuring unit 705. The digital test apparatus 701 is connected to a plurality of analog semiconductor devices 211, 212.

The analog semiconductor device 212 has two pins P3, P4, and outputs a low frequency analog signal LAN2 through the pin P3 and a high frequency analog signal HAN2 through the pin P4.

The digital test apparatus 701 tests the plurality of analog semiconductor devices 211, 212. Accordingly, in addition to the components of the digital test apparatus 201 of FIG. 2, the digital test apparatus 701 includes a low pass filter 222, a rectifying unit 232, a high pass filter 242, a high frequency power detecting unit 252 and comparing units 263, 264. Here, the determining under 271 of FIG. 2 is replaced by a determining under 271a. The determining unit 271a determines whether the signals C01~C04 output from four comparing units 261~264 are good or bad.

The low pass filter 222, the rectifying unit 232, the high frequency pass filter 242 and the high frequency power detecting unit 252 included in the signal converting unit 703 respectively share the same structure and operation as the low pass filter 221, the rectifying unit 231, the high pass filter 241 and the high frequency power detecting unit 251 included in the signal converting unit 703. The comparing units 263, 264 included in the digital measuring unit 705 respectively share the same structure and operation as the comparing units 261, 262 included in the digital measuring unit 705. Accordingly, their description will not be repeated.

The digital test apparatus 701 can simultaneously test the plurality of analog semiconductor devices 211, 212. The plurality of analog semiconductor devices 211, 212 are tested using the digital test apparatus 701, without needing the AC digitizer (135 of FIG. 1), are the test cost is reduced.

Figure 8:
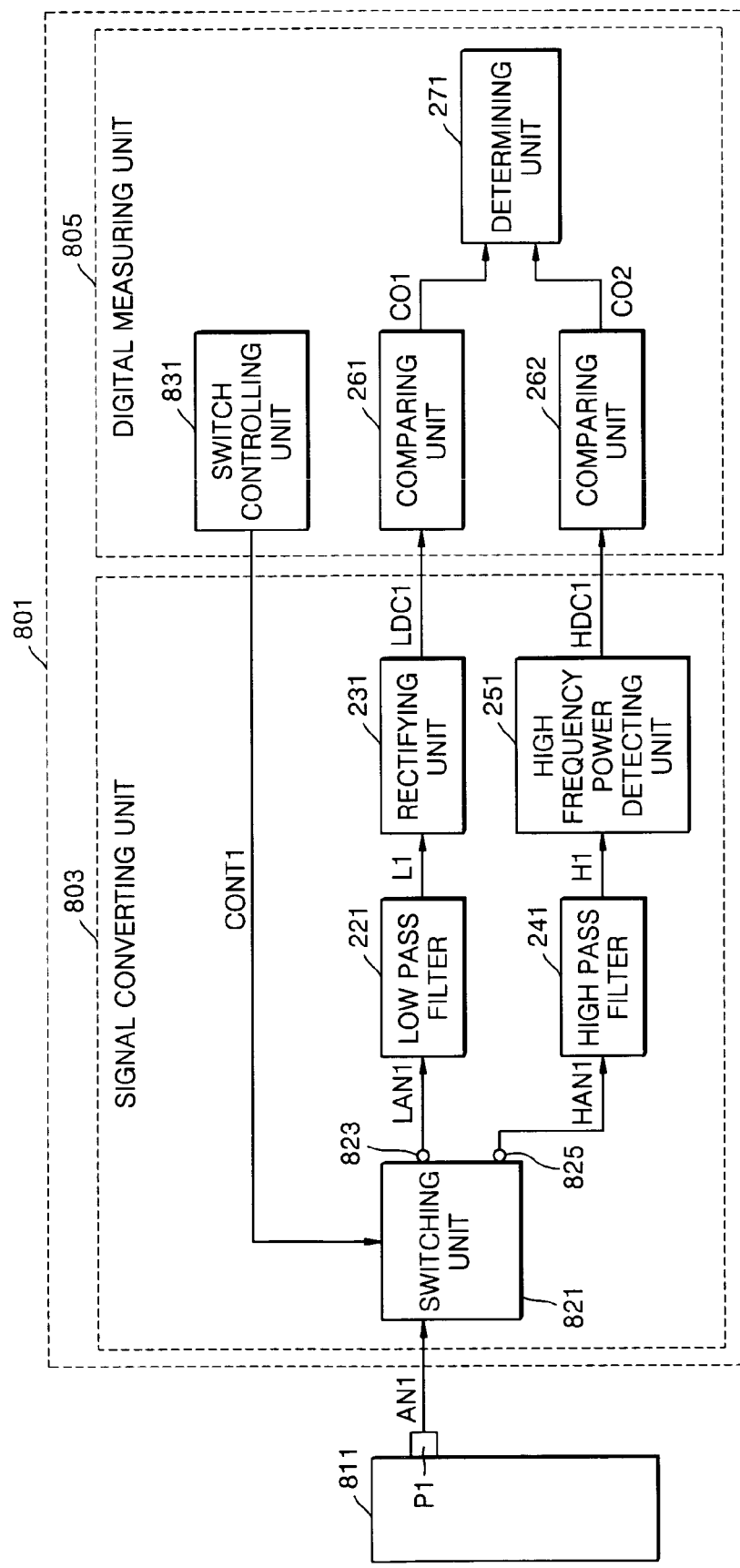
FIG. 8 shows a digital test apparatus according to an exemplary embodiment of the present invention, connected to an analog semiconductor device.

FIG. 8 shows a digital test apparatus according to an exemplary embodiment of the present invention, connected to an analog semiconductor device 811. The digital test apparatus 801 includes a signal converting unit 803 and a digital measuring unit 805.

Here, the analog semiconductor device 811 selectively outputs a low frequency analog signal and a high frequency analog signal through one pin P1. The digital test apparatus 801 tests this type of analog semiconductor device 811.

The signal converting unit 803 includes a switching unit 821, a low pass filter 221, a rectifying unit 231, a high pass filter 241 and a high frequency detecting unit 251. The signal converting unit 803 includes the switching unit 821 in addition to the components of the signal converting unit 201 shown in FIG. 2. Accordingly, the description of the low pass filter 221, the rectifying unit 231, the high pass filter 241 and the high frequency power detecting unit 251 will be omitted.

The switching unit 821 includes two output pins 823, 825 and is controlled by a controlling signal CONT1 to output an analog signal input from the outside through one of the output pins 823, 825. When testing the analog semiconductor device 811, the switching unit 821 receives the analog signal AN1 output through the pin P1 of the analog semiconductor device 811 and is controlled by the controlling signal CONT1 to output the analog signal AN1 through one of the output pins 823, 825. For example, if the controlling signal CONT1 has a high level, the switching unit 821 outputs the analog signal AN1 through the output pin 823, and if the controlling signal CONT1 has a low level, the switching unit 821 outputs the analog signal AN1 through the output pin 825.

If the analog signal AN1 is a low frequency signal, the controlling signal CONT1 is operated such that the analog signal AN1 is output through the output pin 823, and if the analog signal AN1 is a high frequency signal, the controlling signal CONT1 is operated such that the analog signal AN1 is output through the output pin 825. The switching unit 821 preferably comprises a relay.

The digital measuring unit 805 includes the plurality of comparing units 261, 262, the determining unit 271 and a switch controlling unit 831. The digital measuring unit 805 includes the switch controlling unit 831 in addition to the digital measuring unit 205 shown in FIG. 2. Accordingly, the description of the comparing units 261, 262 and the determining unit 271 will be omitted.

The switch controlling unit 831 is electrically coupled to the switching unit 821. The switch controlling unit 831 generates the controlling signal CONT1 and controls the operation of the switching unit 821. The switch controlling unit 831 comprises a central processing unit (CPU) or a microcontroller. The switch controlling unit 831 may be replaced by software.

As mentioned above, since the digital test apparatus 801 includes the switching unit 821 and the switch controlling unit 831, it can measure two analog signals, that is, a low frequency analog signal and a high frequency analog signal, output through a specific pin P1 of the analog semiconductor 811, without changing the structure of the signal converting unit 803 or replacing the signal converting unit 803 with another unit.

Since the analog signal AN1 output from the analog semiconductor device 811 is measured using the digital test apparatus 801, without needing the AC digitizer (135 of FIG. 1), the test cost is greatly reduced.

Figure 9:
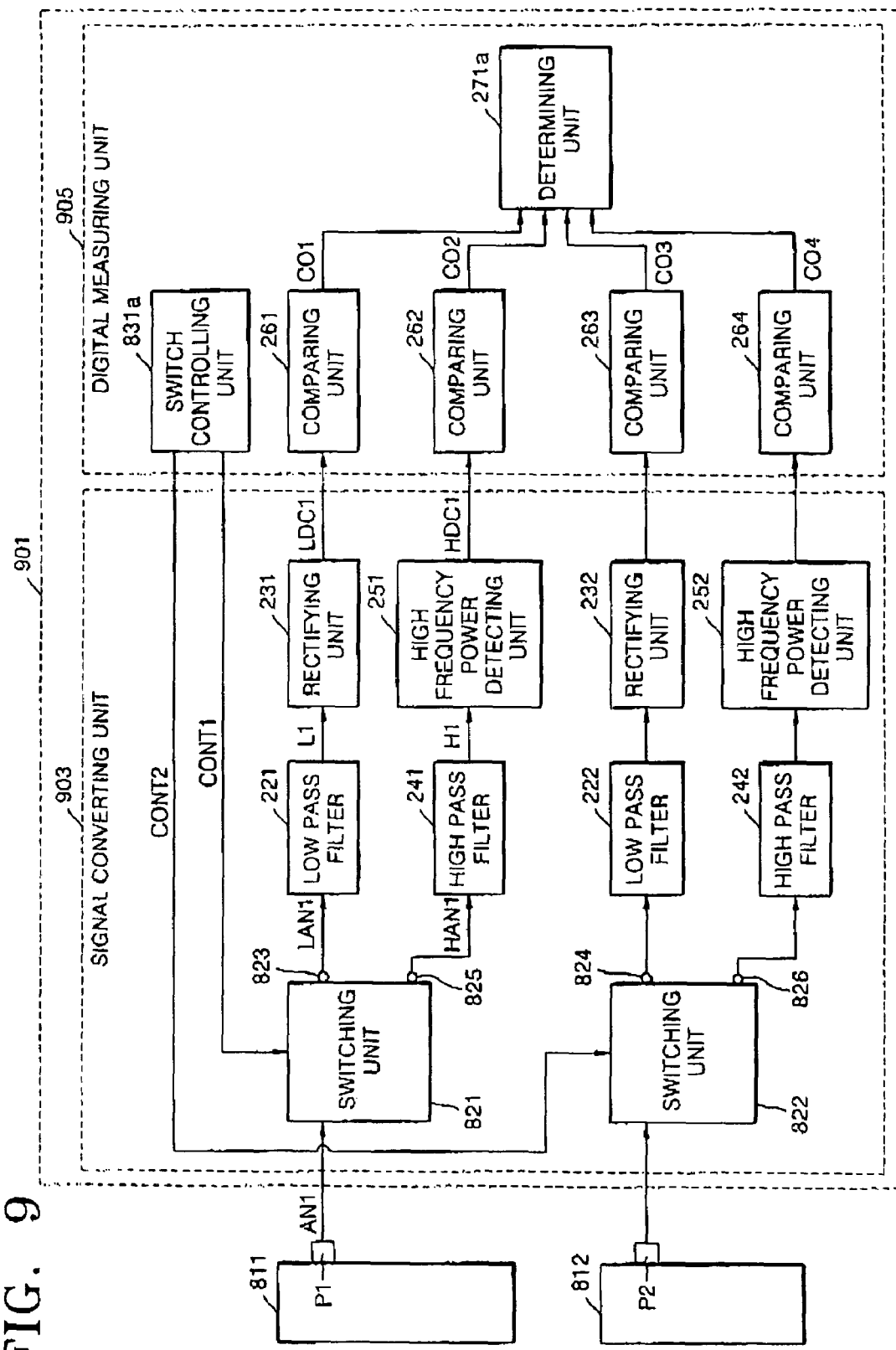
FIG. 9 shows a digital test apparatus according to an exemplary embodiment of the present invention, connected to analog semiconductor devices.

FIG. 9 shows a digital test apparatus according to an exemplary embodiment of the present invention, connected to analog semiconductor devices 811 and 812. The digital test apparatus 901 includes a signal converting unit 903 and a digital measuring unit 905, and is connected to the plurality of analog semiconductor devices 811, 812.

The digital test apparatus 901 tests the plurality of analog semiconductor devices 811, 812.

The analog semiconductor device 812 selectively outputs two analog signals, that is, a low frequency analog signal and a high frequency analog signal, through one pin P2.

The signal converting unit 903 includes a plurality of switching units 821, 822, a plurality of low pass filters 221, 222, a plurality of rectifying units 231, 232, a plurality of high pass filters 241, 242 and a plurality of high frequency power detecting units 251, 252.

Here, the switching unit 822, the low pass filter 222, the rectifying unit 232, the high pass filter 242 and the high frequency power detecting unit 252 respectively share the same structure and operation as the switching unit 821, the low pass filter 221, the rectifying unit 231, the high pass filter 241 and the high frequency power detecting unit 251. Accordingly, their description will not be repeated.

The digital measuring unit 905 includes comparing units 261~264, the determining unit 271a and a switch controlling unit 831a. Here, since the comparing units 263, 264 respectively share the same structure and operation as the comparing units 261, 262, their description will not be repeated.

The determining unit 271a receives the signals C01~C04 output from the comparing units 261~264 and determines whether the signals are good or bad.

The switch controlling unit 831a generates the controlling signals CONT1, CONT2 and controls the operation of the switching units 821, 822.

The digital test apparatus 901 can simultaneously test the plurality of analog semiconductor devices 811, 812.

The plurality of analog semiconductor devices 811, 812 are tested using the digital test apparatus 901, without needing the AC digitizer (135 of FIG. 1), the test cost is reduced.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A digital test apparatus, comprising:
a signal converting unit electrically coupled to an analog semiconductor device, the signal converting unit for converting an analog signal output from the analog semiconductor device into a direct current voltage and outputting the direct current voltage, wherein the signal converting unit comprises:
a low pass filter for passing only a low frequency analog signal from among analog signals output from the analog semiconductor device;
a rectifying unit electrically coupled to the low pass filter, the rectifying unit for converting the analog signal output from the low pass filter into a first direct current voltage and outputting the first direct current voltage;
a high pass filter for passing only a high frequency analog signal from among the analog signals output from the analog semiconductor device; and
a high frequency power detecting unit electrically coupled to the high pass filter, the high frequency power detecting unit for converting the analog signal output from the high pass filter into a second direct current voltage and outputting the second direct current voltage; and
a digital measuring unit electrically coupled to the signal converting unit, the digital measuring unit for measuring the direct current voltage output from the signal converting unit and evaluating the analog signal according to the direct current voltage.

2. The apparatus according to claim 1, further comprising at least one additional signal converting unit and at least one additional digital measuring unit for simultaneously testing a plurality of analog semiconductor devices.

3. The apparatus according to claim 1, wherein the digital measuring unit comprises:
a first comparing unit for comparing the first direct current voltage output from the rectifying unit with a reference voltage;
a second comparing unit for comparing the second direct current voltage output from the high frequency power detecting unit with the reference voltage; and
a determining unit for receiving outputs of the comparing units and evaluating the analog signals output from the analog semiconductor device according to the outputs of the comparing units.

4. The apparatus according to claim 1, wherein the digital measuring unit is implemented in an ATE (automatic test equipment) for testing the semiconductor device.

5. The apparatus according to claim 4, wherein the low pass filter, the rectifying unit, the high pass filter and the high frequency power detecting unit are implemented in a test board for interfacing the semiconductor device with the ATE.

6. The apparatus according to claim 1, further comprising at least one addition low pass filter, at least one addition rectifying unit, at least one addition high pass filter, at least one addition high frequency power detecting unit and at least one addition comparing unit for simultaneously testing a plurality of analog semiconductor devices.

7. The apparatus according to claim 1, wherein the analog semiconductor device comprises a first pin which outputs the low frequency analog signal and a second pin which outputs the high frequency analog signal, wherein the low pass filter is electrically coupled to the first pin, and the high pass filter is electrically coupled to the second pin.

8. The apparatus according to claim 7, wherein the analog semiconductor device includes at least one addition pin for outputting a second low frequency analog signal and at least one additional pin for outputting a second high frequency analog signal.

9. The apparatus according to claim 1, further comprising:
a switching unit which includes a first output pin and a second output pin, the switching unit for receiving the low frequency analog signal and the high frequency analog signal output from the analog semiconductor device, the switching unit is controlled by a controlling signal to output the low frequency analog signal through the first output pin and output the high frequency analog signal through the second output pin.

10. The apparatus according to claim 9, wherein the switching unit comprises a relay controlled by the controlling signal.

11. The apparatus according to claim 9, wherein the digital measuring unit further comprising
a switch controlling unit for generating the controlling signal.

12. The apparatus according to claim 9, wherein the analog semiconductor device comprises an analog semiconductor device pin which outputs both the low frequency analog signal and the high frequency analog signal, wherein the switching unit is electrically coupled to the analog semiconductor device pin.

13. The apparatus according to claim 12, wherein a plurality of pins of the analog semiconductor device output both low frequency analog signals and high frequency analog signals.

* * * * *